(12) United States Patent
Kunihiro et al.

(10) Patent No.: US 6,278,144 B1
(45) Date of Patent: *Aug. 21, 2001

(54) FIELD-EFFECT TRANSISTOR AND METHOD FOR MANUFACTURING THE FIELD EFFECT TRANSISTOR

(75) Inventors: Kazuaki Kunihiro; Yasuo Ohno; Yuji Takahashi, all of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/248,490

(22) Filed: Feb. 10, 1999

(30) Foreign Application Priority Data

Feb. 12, 1998 (JP) .................................... 10-029999

(51) Int. Cl.⁷ ........................ H01L 29/80; H01L 31/112
(52) U.S. Cl. ........................ 257/280; 257/279; 257/284
(58) Field of Search ........................ 257/280, 279, 257/284, 289, 471, 192, 194

(56) References Cited

U.S. PATENT DOCUMENTS

| 4,471,367 | * | 9/1984 | Chen et al. ........................ 257/192 |
| 4,636,823 | * | 1/1987 | Margalit et al. ........................ 257/192 |
| 4,839,703 | * | 6/1989 | Ohata et al. ........................ 257/192 |

FOREIGN PATENT DOCUMENTS

| 64-61066 | 3/1989 | (JP) . |
| 3-280552 | 12/1991 | (JP) . |
| 4-10440 | 1/1992 | (JP) . |
| 4-3433 | 1/1992 | (JP) . |
| 5-275467 | 10/1993 | (JP) . |

* cited by examiner

Primary Examiner—Sara Crane
Assistant Examiner—Thien F Tran
(74) Attorney, Agent, or Firm—Hutchins, Wheeler & Dittmar

(57) ABSTRACT

A high power FET has a first conductivity epitaxial layer overlying a semi-insulating substrate, a second conductivity epitaxial layer, a gate being in Schottky contact with the second conductivity layer, and source and drain regions being in ohmic contact with the second conductivity layer. Impurity concentration N2 and thickness D of the second conductivity layer are such that the following relationship holds:

$$d > \sqrt{\frac{2\varepsilon_S \phi_S}{eN_2}} + \sqrt{\frac{2\varepsilon_S V_{bi}}{eN_2} \frac{N_1}{N_1 + N_2}}$$

wherein $N_1$, is the impurity concentration of the first conductivity epitaxial layer, $\phi_s$, $\varepsilon_s$ and $V_{bi}$, are surface potential, dielectric constant and a diffused potential, respectively, of the second conductivity epitaxial layer, and e is an elementary charge of electron. An electrically neutral region is formed in the second conductivity epitaxial layer when no voltage is applied between the gate and the source region, whereby the electrically neutral region functions similarly to the gate of a cascode-connected MOSFET, which improves the breakdown voltage of the FET.

2 Claims, 9 Drawing Sheets

FIELD-EFFECT TRANSISTOR AND METHOD FOR MANUFACTURING THE FIELD EFFECT TRANSISTOR

BACKGROUND OF THE INVENTION

1. Field of the Invention

The present invention relates to a field-effect transistor and, more particularly, to a field-effect transistor having improved, stabilized off-state breakdown voltage as measured between a gate and a drain, as well as to a method for manufacturing the field-effect transistor.

2. Description of the Related Art

Breakdown voltage is a parameter that determines a maximum output power of a power field-effect transistor (power FET). According to a known method for designing the breakdown voltage of a silicon MOSFET, in which a lightly-doped drain (LDD) region existing between a gate and a drain is regarded a junction FET, the device is considered to have a structure such that a MOSFET and the junction FET are cascode-connected. This idea enables the following design practice for an n-type MOSFET, for example. By adjustment of the dosage of n-type ions implanted into the LDD region existing between a gate and a drain and adjustment of the impurity concentration of a p-type substrate, it becomes possible to arbitrarily choose a design ratio of the voltage applied between the gate and the drain to the voltage applied between the source and the drain. Thus, the on-state breakdown voltage between the source and the drain can be accurately controlled. This technique is described in Proceedings of the 6th Conference on Solid State Devices, p249.

For high power microwave FETs used, for example, in base stations for mobile communications and satellite communications, gallium arsenide (hereinafter abbreviated as GaAs) MESFETs and GaAs heterojunction FETs (HJFETs) have been employed. In contrast to the case of MOSFETs that use a gate insulating film, in these GaAs FETs, a Schottky metal of a gate (hereinafter referred to as a gate metal) exhibits a lower Zener breakdown voltage. Thus, in addition to improvement of off-state breakdown voltage, the on-state breakdown voltage between the gate and the drain must be improved.

FIG. 1 shows a conventional FET in section. According to a known method for improving the on-state breakdown voltage of a GaAs MESFET, an intentionally undoped i-GaAs layer (numeral 44 in FIG. 1) is formed as a surface layer of the FET which is in Schottky contact with the gate. This structure improves the maximum reverse breakdown voltage of the gate metal; specifically, the on-state breakdown voltage of the FET is 20 V or higher. This technique is described in IEICE Transactions, Vol. E74, No. 12, 1991.

As an alternative technique, there is widely used an LDD structure in which the impurity concentration of the region existing between a gate and a drain is made lower than that of an ohmic region, as in the case of a MOSFET. In this structure, since the impurity concentration in the vicinity of the gate is lower than that of the ohmic region, electric-field concentration at a gate surface is alleviated. This technique is described in The 17th GaAs IC Symposium, 1995, Technical Digest. By adjustment of the length of the LDD region, a breakdown voltage of 25 V or higher is obtained.

The conventional techniques as described above have provided some advantages, but cannot necessarily exert complete control over the on-state breakdown voltage of GaAs FETs to obtain both the high breakdown voltages. This is because, in the case of GaAs, a high surface state density exists on the surface of a semiconductor, and the surface state density have a great effect on the on-state breakdown voltage, whereas the properties of the surface state density depend on the type of a film and the filming process thereof and are thus difficult to control. In short, the on-state breakdown voltage varies greatly with uncertain factors in a fabrication process, causing frequent occurrence of breakdown defect during fabrication.

Since, in many cases, GaAs FETs employ an epitaxial wafer in which semiconductor layers are grown in the vertical direction, a doping profile cannot be varied parallel to the substrate surface. Thus, application of a cascode connection to a design for a breakdown voltage control as in the case of a silicon MOSFET is difficult in the GaAs FET. Even if an LDD structure is formed in an ordinary GaAs FET by means of ion implantation, the on-state breakdown voltage of the FET is difficult to control, because, in the GaAs FET, dosage of the substrate is usually not controlled for this purpose, and thus, the electric potential of the surface state is unstable.

SUMMARY OF THE INVENTION

In view of the above, it is an object of the present invention to provide a field effect transistor having an improved, stable on-state breakdown voltage between gate and source thereof.

It is another object of the present invention to provide a process for fabricating the field effect transistor as mentioned above.

The present invention provides a field effect transistor including a substrate, a first epitaxial layer overlying the substrate and having a first conductivity, a second epitaxial layer formed on the first epitaxial layer and having a second conductivity, source and drain regions in ohmic contact with the second epitaxial layer, and a gate metal formed on the second epitaxial layer in Schottky contact therewith, the second epitaxial layer having an impurity concentration and a thickness such that an electrically neutral region is formed when the gate metal has a potential substantially equal to a potential of the drain region.

The present invention also provides a method for fabricating a field effect transistor including the steps of depositing a first epitaxial layer having a first conductivity and overlying a substrate, depositing a second epitaxial layer having a second conductivity on the first epitaxial layer, forming an ohmic layer on the second epitaxial layer, forming an ohmic layer having a first conductivity on the second epitaxial layer, forming a gate in Schottky contact with the second epitaxial layer and source and drain regions on the ohmic layer, and selectively etching the second epitaxial layer to form an opening for exposing a portion of the first epitaxial layer by using an etchant, the etchant and a semiconductor material of the epitaxial layer being selected such that an etch rate of the second epitaxial layer is lower than an etch rate of the ohmic layer.

In accordance with the field effect transistor of the present invention and fabricated by the method of the present invention, the electrically neutral region functions similarly to the gate of the cascode-connected MOSFET, which improves both the on-state breakdown voltage in the FET.

The above and other objects, features and advantages of the present invention will be more apparent from the following description, referring to the accompanying drawings.

DESCRIPTION OF THE PREFERRED EMBODIMENTS

Figure 1:
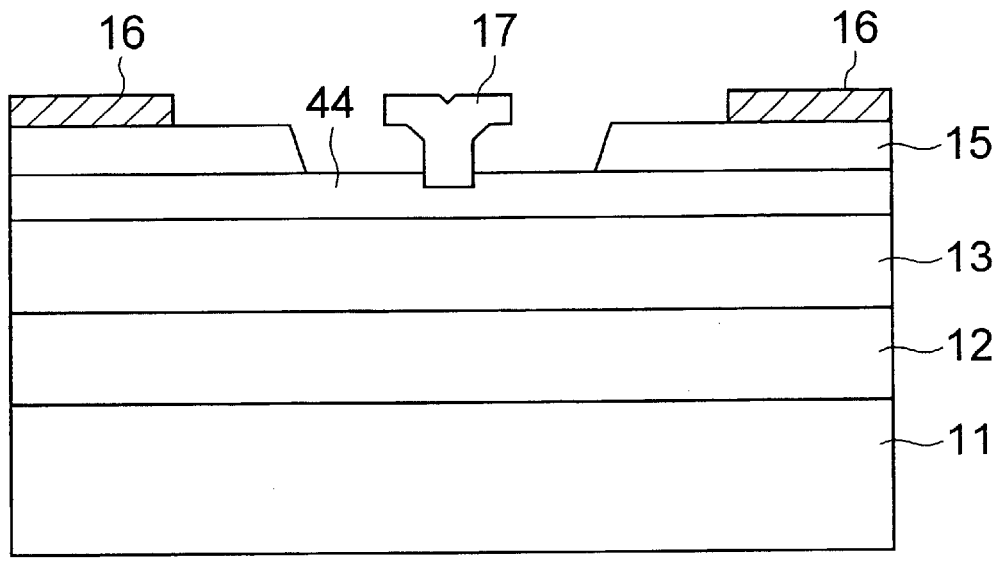
FIG. 1 is a sectional view of a conventional FET.

Now, the present invention is more specifically described with reference to accompanying drawings, wherein similar constituent elements are designated by similar reference numerals throughout the drawings.

Figure 2:
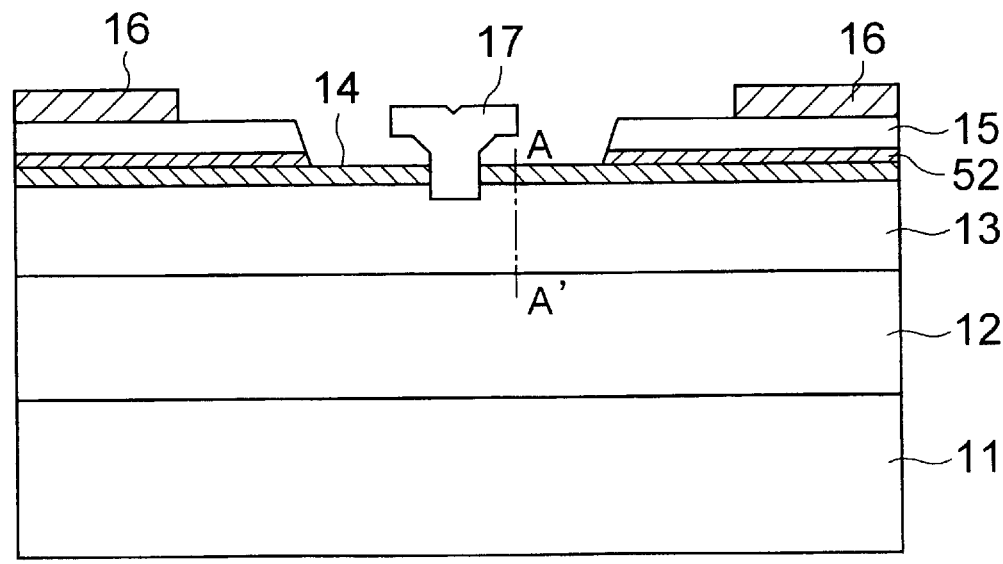
FIG. 2 is a sectional view of an FET according to a first embodiment of the present invention.

Referring to FIG. 2, a GaAs MESFET according to a first embodiment of the present invention includes a semi-insulating GaAs substrate 11 and the following layers formed sequentially on the substrate 11: a buffer layer 12; an n-GaAs channel layer 13 (dosed at $2\times10^{17}$ cm$^{-3}$, and 235-nm thick); a p-GaAs layer 14 ($2\times10^{18}$ cm$^{-3}$, 40 nm); an n-GaAs ohmic layer 15 ($5\times10^{17}$ cm$^{-3}$, 100 nm); an ohmic metal (Au/Ge/Ni) 16 serving as a source and a drain; and a gate metal (WSi/Au) 17 serving as a gate. The gate metal penetrates the p-GaAs layer 14 to reach the n-GaAs layer 13 to be in electric contact therewith.

Figure 3A:
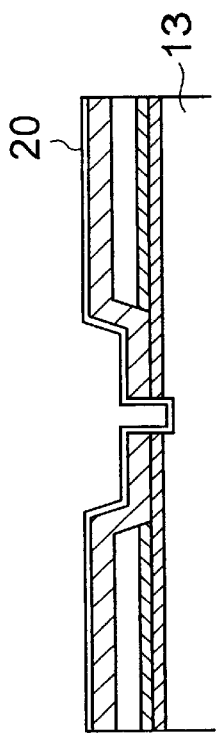
FIGS. 3A to 3H are sectional views illustrating consecutive steps in fabricating the FET of the first embodiment.

FIGS. 3A to 3H illustrate the steps of fabricating the MESFET of the present embodiment. As shown in FIG. 3A, a semiconductor crystalline wafer having epitaxial layers 14 and 15 is formed by a molecular beam epitaxial (MBE) method; a photoresist 18 is applied onto the crystalline wafer; and the wafer is subjected to exposure and patterning to thereby form an opening in the photoresist 18 at a position corresponding to a recess-to-be of the FET. Next, the n-GaAs ohmic layer 15 doped with Si at $5\times10^{17}$ cm$^{-3}$ and having a thickness of 100 nm is removed by etching so as to expose the p-GaAs layer 14 doped with Be at $2\times10^{18}$ cm$^{-3}$ and having a thickness of 40 nm. The etching process may be performed by use of a phosphoric acid etchant and under time control so as to expose the p-GaAs layer 14. In order to improve etching accuracy, GaAs/AlGaAs selective etching is more preferred. In the present embodiment, the wafer is subjected to a wet selective etching by use of an aqueous solution which contains 50% citric acid and 30% hydrogen peroxide at a ratio of 3:1 by volume. After exposing an n-Al$_{0.3}$Ga$_{0.7}$As layer 52 having a thickness of 5 nm and serving as an etch stop layer, the etch stop layer 52 is etched by means of hydrochloric acid for a short period of time so as to expose the p-GaAs layer 14.

Figure 3B:
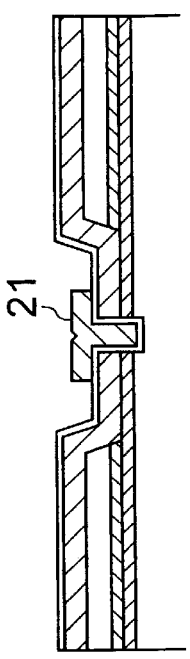
Figure 3C:
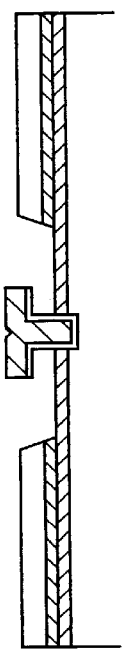

Next, as shown in FIG. 3B, a SiO$_2$ film 19 serving as a mask for dry etching is formed to a thickness of 700 nm over the entirety of the FET. A WSi film 20A serving as a mask for dry etching is deposited on the film 19 by sputtering. As shown in FIG. 3C, a photoresist is applied onto the mask WSi film 20A to form a photoresist film 82 having an opening at a position corresponding to the gate-to-be. The mask WSi film 20A is removed through the opening by a magnetron ion etching (MIE) method. Then, the SiO$_2$ film 19 is selectively removed through the opening by a reactive ion etching (RIE) method.

Figure 3D:
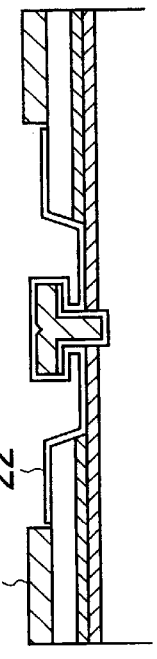
Figure 3E:
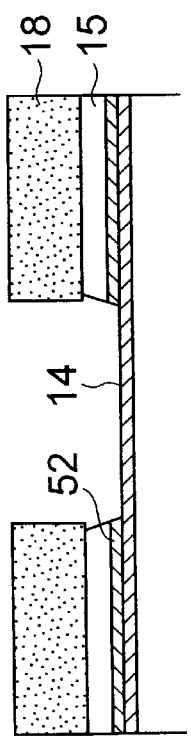
Figure 3F:
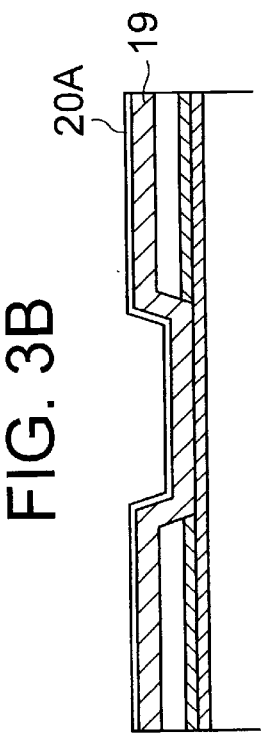
Figure 3G:
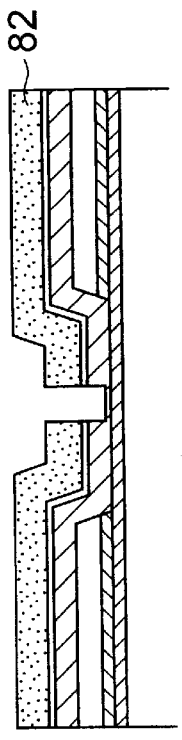
Figure 3H:
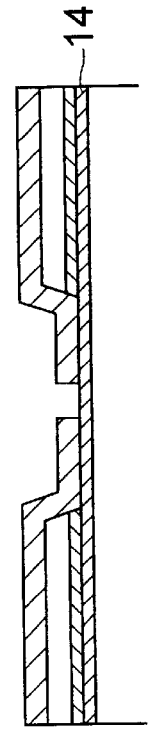

As shown in FIG. 3D, after the photoresist 82 is removed, the SiO$_2$ film 19 is selectively etched at the opening by a less-damaging MIE method so as to expose through the opening the p-GaAs layer 14. As shown in FIG. 3E, by using a phosphoric acid based etchant, the p-GaAs layer 14 is removed through the opening, and the n-GaAs channel layer 13 is etched through the opening to a depth of 20 nm. Next, a gate metal WSi 20 is deposited on the entire surface of the FET by sputtering. As shown in FIG. 3F, in order to decrease the gate resistance, a gate metal Au 21 is deposited by evaporation, and the deposited gate metal Au 21 is formed into a desired gate shape by an ion milling method. As shown in FIG. 3G, a portion of the SiO$_2$ film 19 located under the gate is removed by using hydrofluoric acid. As shown in FIG. 3H, a regular surface protection film (SiO$_2$) 22 is formed, and the ohmic metal (Au/Ge/Ni) 16 is formed. A wiring process follows to complete the FET of the present embodiment.

Figure 4:
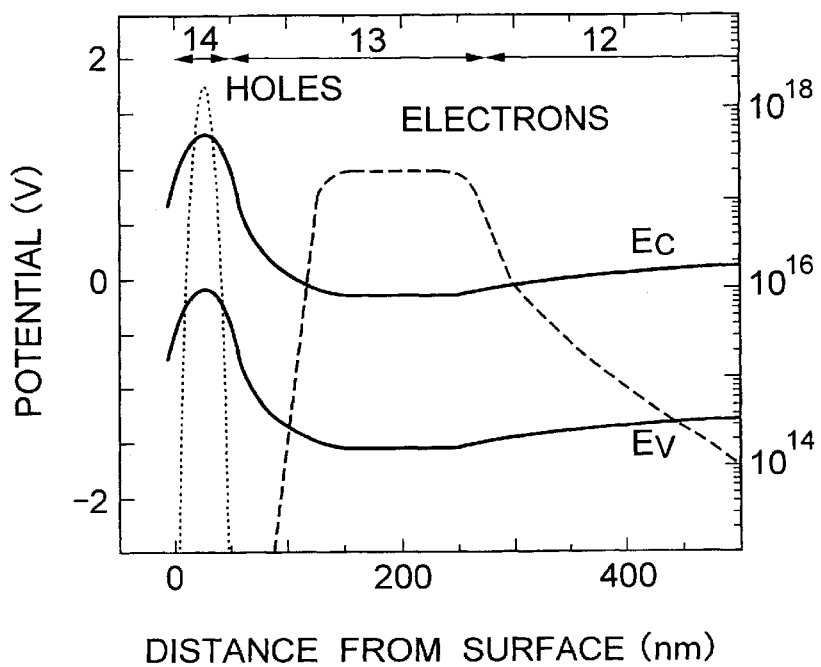
FIG. 4 is a graph showing potential change and carrier concentration distribution along line A–A' of FIG. 2.

FIG. 4 shows potential distribution and carrier concentration distribution along line A–A' of FIG. 2. On the p-GaAs layer 14, holes are accumulated to form an electrically neutral region. Herein, an epitaxial layer is designed such that the concentration $N_2$ of the second conductive semiconductor layer and the thickness d of the second conductive semiconductor layer satisfy the following relationship:

$$d > \sqrt{\frac{2\varepsilon_S \phi_S}{eN_2}} + \sqrt{\frac{2\varepsilon_S V_{bi}}{eN_2} \frac{N_1}{N_1 + N_2}}$$

where $N_1$, is the impurity concentration of a first conductivity-type active layer in contact with a second conductive-type semiconductor layer, $\phi_s$ is the surface potential of the second semiconductor layer, $\varepsilon_s$ is the dielectric constant, $V_{bi}$ is the diffusion potential, and e is an elementary charge of electron.

Figure 5:
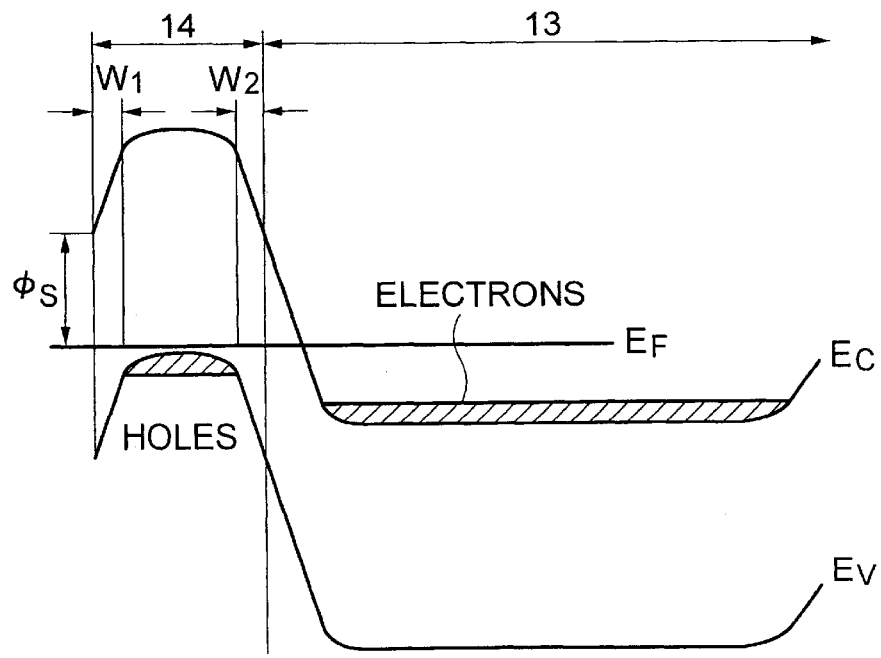
FIG. 5 is a diagram showing widths of depletion layers in the first embodiment.

FIG. 5 shows the widths of depletion layers in detail. $W_1$ denotes the width of a surface depletion layer and corresponds to the first term of the above expression. $W_2$ denotes the width of a depletion layer located on the channel layer side and corresponds to the second term of the above expression. With $\phi_s=0.7$ V, $V_{b1}=0.8$ V, and $N_1=2\times10^{17}$ cm$^{-3}$, the requirement d>30 nm is obtained for $N_2=2\times10^{18}$ cm$^{-3}$. Herein, d=40 nm is employed.

Figure 6:
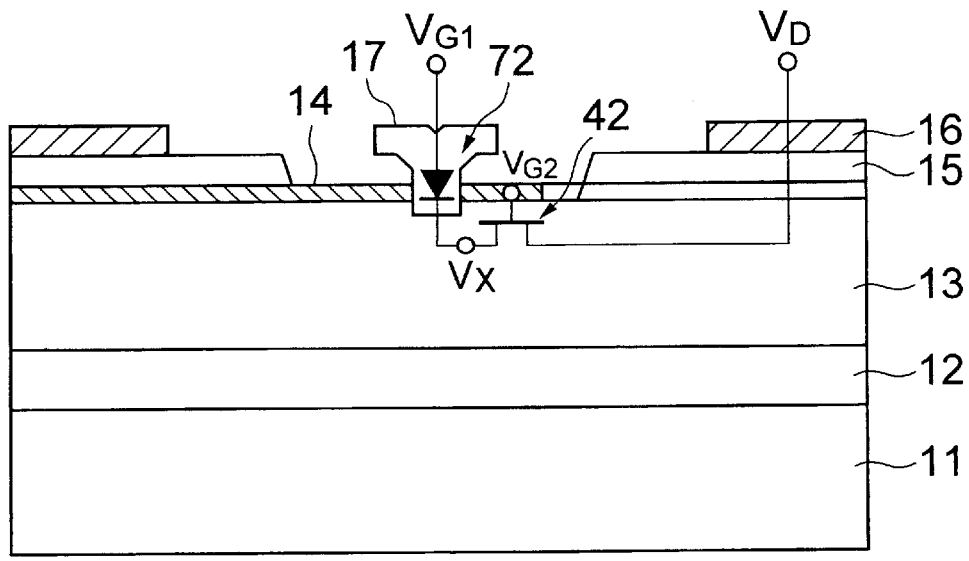
FIG. 6 is an equivalent circuit diagram showing operation of the FET of the first embodiment.

FIG. 6 shows an equivalent circuit diagram illustrating the action of the present invention. The gate metal (WSi/Au) 17 is considered to have properties close to those of a p-type material; thus, the gate, the surface p-GaAs layer, and the drain form a p-p-n junction (gate/(surface p-GaAs layer)/drain). In this case, when a voltage is applied between the gate and the drain such that the gate potential is negative with respect to the drain potential, a reverse bias voltage is applied to the p-n junction between the surface p-GaAs layer and the drain. As a result, the p-GaAs layer 14 begins to become depleted of current carriers from the drain side. By contrast, in the p-GaAs layer 14, a neutral region still remains on the gate side. This structure is represented by the equivalent circuit in which an equivalent FET 42 is cascode-connected to an equivalent diode 72 of the gate. The neutralized p-GaAs layer corresponds to the gate region of this FET. The electric potential $V_{G2}$ of the p-GaAs layer 14 is substantially equivalent to the electric potential $V_{G1}$ of the gate.

Figure 7:
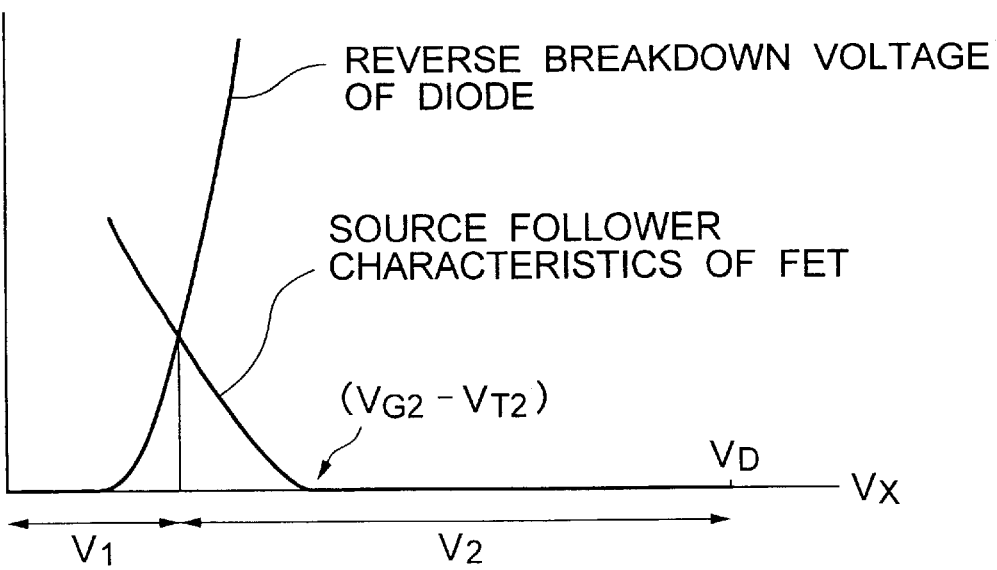
FIG. 7 is a graph showing the operational principle of the invention.

FIG. 7 shows a graph illustrating the operation of the equivalent circuit. The abscissa of the graph represents an electric potential $V_x$ at the node connecting the equivalent diode 72 and the equivalent FET 42. The intersection of the Zener breakdown characteristic curve of a Schottky diode and the source follower characteristic curve of the equivalent FET 42 represents current that flows between the gate and the drain. A voltage at which current flow starts in the source follower characteristic is represented by the difference ($V_{G2}-V_{T2}$) between the gate voltage $V_{G2}$ and the threshold voltage $V_{T2}$ of the equivalent FET 42. A portion, $V_1$, of the voltage applied between the gate and the drain is applied to the Schottky diode, whereas a portion, $V_2$, of the voltage is applied to the FET. The maximum reverse breakdown voltage of the gate metal depends on the semiconductor material and impurity concentration; thus, in order to maintain a high breakdown voltage, the difference "$V_{G2}-V_{T2}$" must be controlled such that $V_1$, is small enough to prevent an excessive bias voltage from being applied to the Schottky diode.

In the conventional FET, the surface state density of a semiconductor plays a role of the gate of the equivalent FET 42. In the case where the surface state density exhibits a hole trap which is apt to capture holes, the electric potential $V_{G2}$ of the surface state approaches the electric potential of the gate; thus, the breakdown voltage is maintained at a certain high level. By contrast, in the case where the surface state density exhibits an electron trap which is apt to capture electrons, the electric potential $V_{G2}$ approaches a drain voltage $V_D$; consequently, a bias voltage is applied to the Schottky diode, resulting in reduction in the breakdown voltage. As mentioned previously, these properties of the surface state are generally difficult to control; thus, stabilization of the breakdown voltage is difficult.

By contrast, according to the present invention, since the p-GaAs layer is specifically formed as a surface layer of the FET, the gate potential $V_{G2}$ of the FET can be controlled without direct influence of the surface state density. In this case, the thickness of the p-GaAs layer is designed larger than the sum of the thickness of the surface depletion layer and the thickness of the depletion layer formed on the channel side. The p-GaAs layer is also expected to absorb holes, which are generated by collision ionization and cause reduction in the breakdown voltage. Thus, according to the present invention, a high breakdown voltage can be stably maintained.

Figure 8:
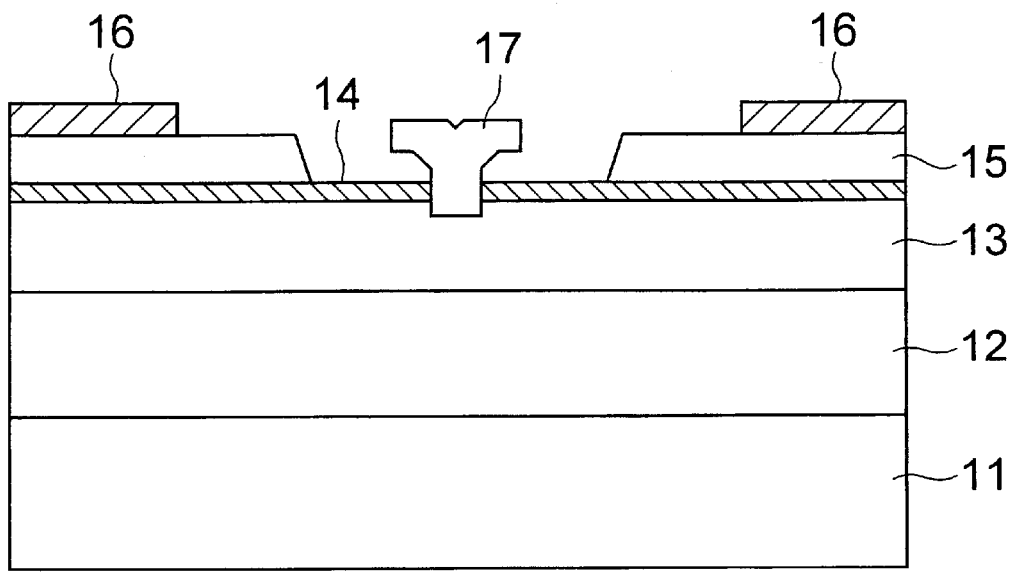
FIG. 8 is a sectional view of an FET according to a second embodiment of the present invention.

FIG. 8 shows a field-effect transistor according to a second embodiment of the present invention. The FET of the present embodiment includes a semi-insulating GaAs substrate 11 and the following layers formed sequentially on the substrate 11: a buffer layer 12; a 235-nm-thick n-GaAs channel layer 13 doped with Si at $2\times10^{17}$ cm$^{-3}$; a 40-nm-thick $Al_{0.3}Ga_{0.7}As$ (p-GaAs) layer 14 doped with C at $2\times10^{18}$ cm$^{-3}$; and a 100-nm-thick n-GaAs ohmic layer 15 doped with Si at $5\times10^{17}$ cm$^{-3}$. By employment of $Al_{0.3}Ga_{0.7}As$ as the p-GaAs layer 14, in a step equivalent to FIG. 3A, the p-GaAs layer 14 itself plays a role of etch stopper. Accordingly, the etch stop layer 52 is unnecessary in the present embodiment, thereby simplifying the fabrication process.

Figure 9:
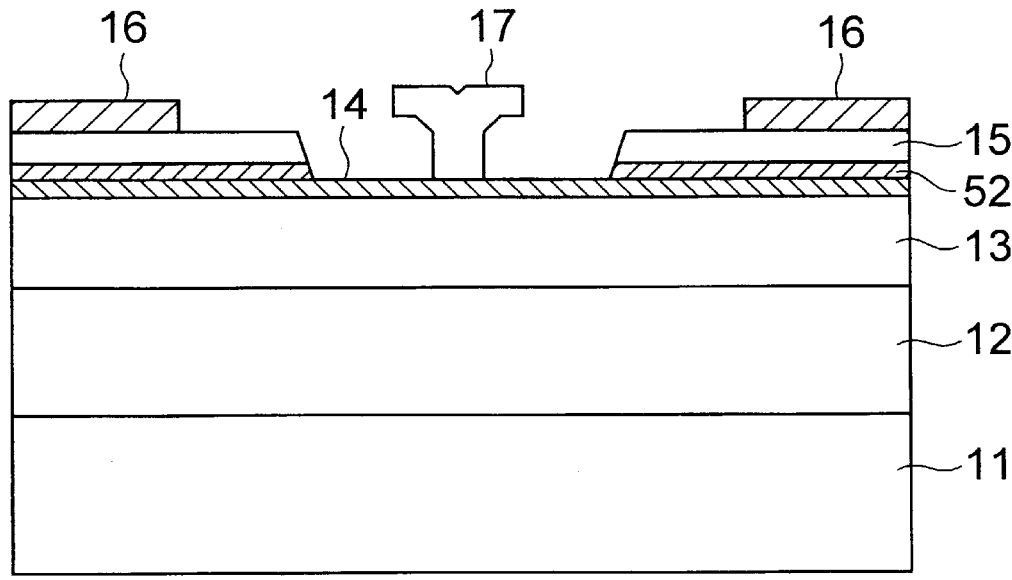
FIG. 9 is a sectional view of an FET according to a third embodiment of the present invention.

FIG. 9 shows a field-effect transistor according to a third embodiment of the present invention. The FET of the present embodiment is similar to the first embodiment of FIG. 2 in the arrangement of epitaxial layers except that the gate metal WSi 17 is formed such that its tip does not extend through the p-GaAs layer 14. By employment of this structure, the maximum reverse breakdown voltage of the gate metal 17 is improved, whereas a high breakdown voltage is maintained by the cascode connection between the gate and the drain.

Figure 10:
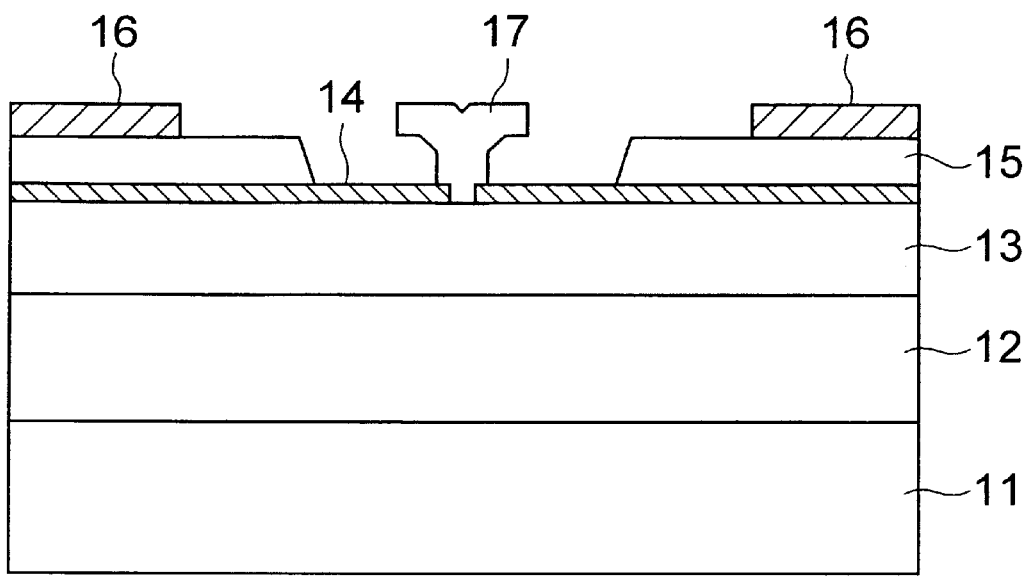
FIG. 10 is a sectional view of an FET according to a fourth embodiment of the present invention.

FIG. 10 shows a field-effect transistor according to a fourth embodiment of the present invention. The FET of the present embodiment is similar to the first embodiment of FIG. 2 in the arrangement of epitaxial layers except the following features. The gate metal WSi 17 has a step, from which the tip of the gate metal 17 protrudes downward and extends through the p-GaAs layer 14 such that the step abuts the top surface of the p-GaAs layer 14 whereas the bottom end of the tip of the gate metal 7 abuts the top surface of the n-GaAs channel layer 13. As a result, the electrical contact area between the gate metal 17 and the p-GaAs layer 14 increases. Further, by adjustment of the thickness of the p-GaAs layer 14 through which the gate extends, the threshold voltage of the FET can be adjusted, thereby expanding the design choice.

Figure 11:
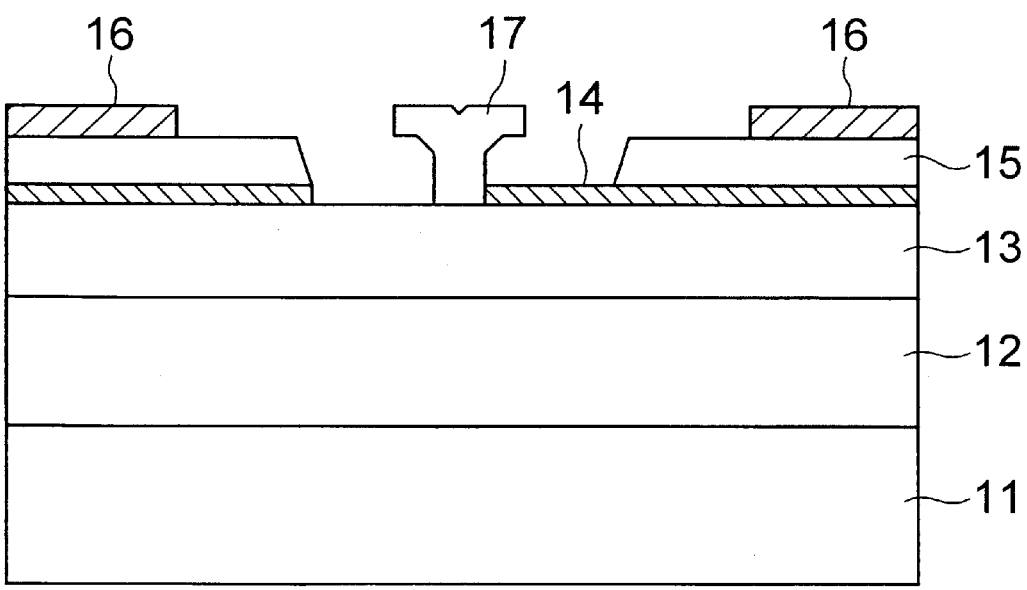
FIG. 11 is a sectional view of an FET according to a fifth embodiment of the present invention.

FIG. 11 shows a field-effect transistor according to a fifth embodiment of the present invention. The FET of the present embodiment is similar to the first embodiment of FIG. 2 in the arrangement of epitaxial layers except that a portion of the p-GaAs layer 14 extending between the source and the gate is removed. During operation of an ordinary FET, a high breakdown voltage is generally required only between the gate and the drain, and thus a high voltage is not applied between the source and the gate. Accordingly, the portion of the p-GaAs layer 14 that extends between the source and the gate is not necessary. By removal of the portion of the p-GaAs layer 14, the parasitic capacitance involved between the gate metal 17 and the p-GaAs layer 14 on the source side decreases; thus, an improvement in high-frequency characteristics can be expected.

Figure 12:
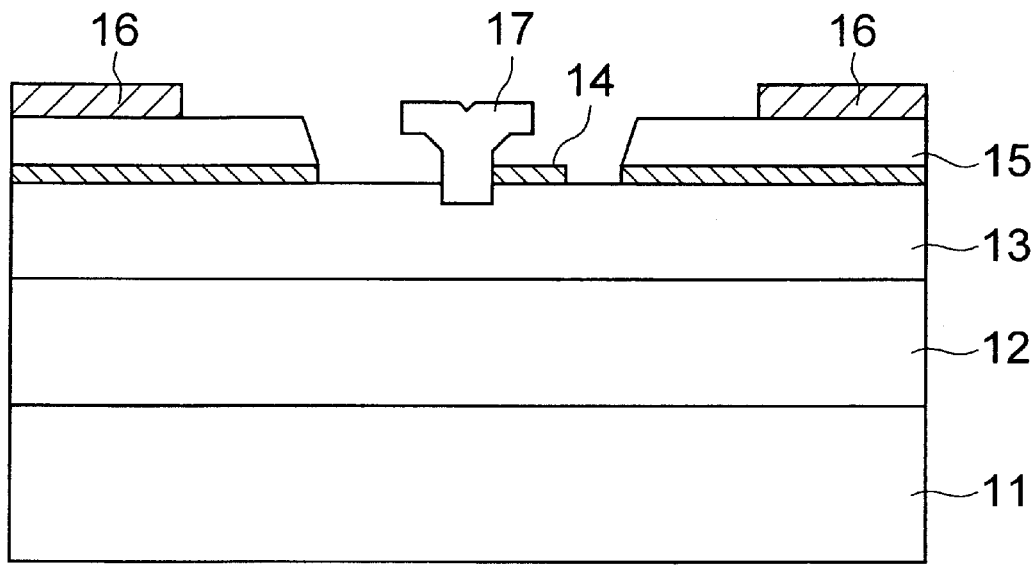
FIG. 12 is a sectional view of an FET according to a sixth embodiment of the present invention.

FIG. 12 shows a field-effect transistor according to a sixth embodiment of the present invention. The FET of the present embodiment is similar to the first embodiment of FIG. 2 in the arrangement of epitaxial layers except the following features. The p-GaAs layer 14 provided between the gate 17 and the drain is in contact with the gate metal WSi 17 and is not in electrical contact with the n-GaAs ohmic layer 15 on the drain side. As a result, the electric potential of the p-GaAs layer 14 approaches the electric potential of the gate 17 without influence of the electric potential of the drain. Accordingly, the cascode-connection in the aforementioned circuit for maintaining a high breakdown voltage functions more effectively. By designing a length for the p-GaAs layer 14 in addition to an impurity concentration and a thickness of the p-GaAs layer 14, the design choice of the FET can be expanded.

Figure 13:
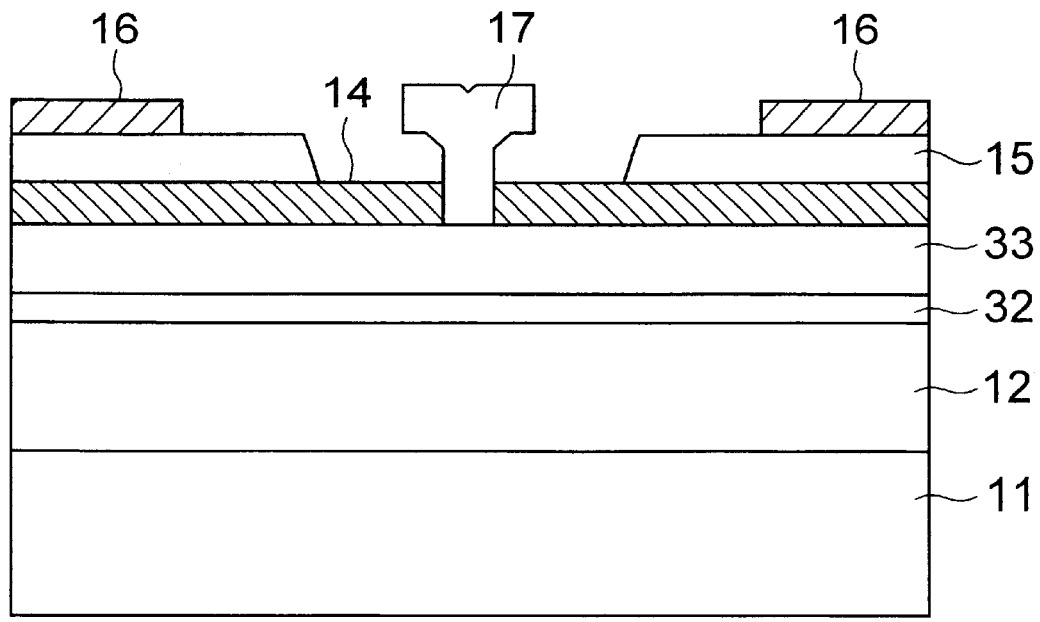
FIG. 13 is a sectional view of an FET according to a seventh embodiment of the present invention.

FIG. 13 shows a field-effect transistor according to a seventh embodiment of the present invention. The FET of the present embodiment is an example of application of pseudomorohic lattice matching of AlGaAs/InGaAs to a heterojunction FET (HJFET). The FET of the present embodiment includes: a semi-insulating GaAs substrate 11; a buffer layer 12; a high-purity i-$In_{0.15}Ga_{0.85}As$ channel layer 32 (15 nm); an n-$Al_{0.2}Ga_{0.8}As$ donor layer 33 (35 nm) doped with Si at $2\times10^{18}$ $cm^{-3}$; an-$Al_{0.2}Ga_{0.8}As$ (p-GaAs) layer 14 (40 nm) doped with C at $2\times10^{18}$ $cm^{-3}$; and a GaAs layer (60 nm) doped with Si at $5\times10^{18}$ $cm^{-3}$. In this case, breakdown voltage can be also improved as in the case of the first embodiment of FIG. 2.

Figure 14:
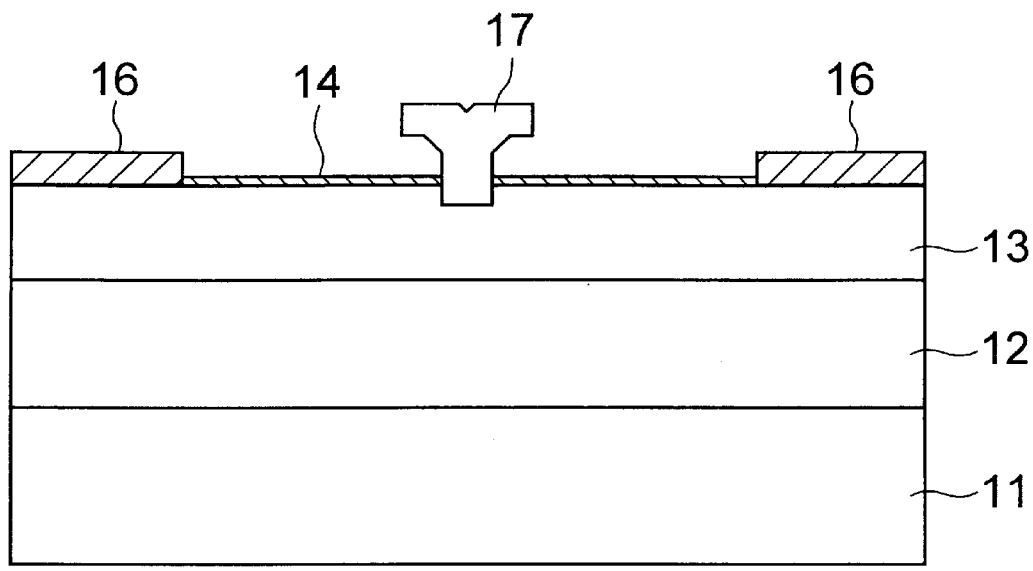
FIG. 14 is a sectional view of an FET according to an eighth embodiment of the present invention.

FIG. 14 shows a field-effect transistor according to an eighth embodiment of the present invention. The FET of the present embodiment differs from that of FIG. 2 in that the n-GaAs ohmic layer 15 is not provided and that the ohmic metal 16 (AuGeNi) is formed after removal of the p-GaAs layer 14. Rapid thermal annealing (RTA) is performed for alloying at 450° C. for 2 minutes. Since the ohmic metal 16 directly penetrates into the n-GaAs channel layer 13, the use of the p-GaAs layer 14 scarcely raises the contact resistance.

Figure 15:
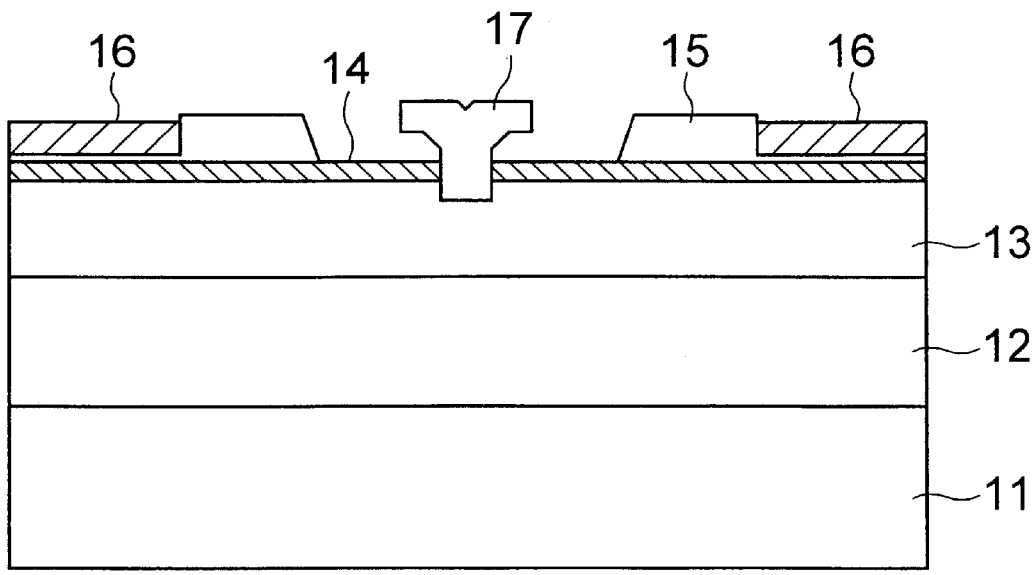
FIG. 15 is a sectional view of an FET according to a ninth embodiment of the present invention.

FIG. 15 shows a field-effect transistor according to a ninth embodiment of the present invention. The FET of the present embodiment is similar to the first embodiment of FIG. 2 in the arrangement of epitaxial layers and in the fabrication process (FIGS. 3A to 3H) except that the n-GaAs ohmic layer 15 is etched to a depth of 50 nm, followed by vapor deposition of the ohmic metal (AuGeNi) 16 on the etched portion. After deposition of the ohmic metal 16, RTA is performed for alloying at 450° C. for 2 minutes. Since the ohmic metal penetrates into the n-GaAs channel layer 13, the use of the p-GaAs layer 14 scarcely raises the contact resistance.

Figure 16:
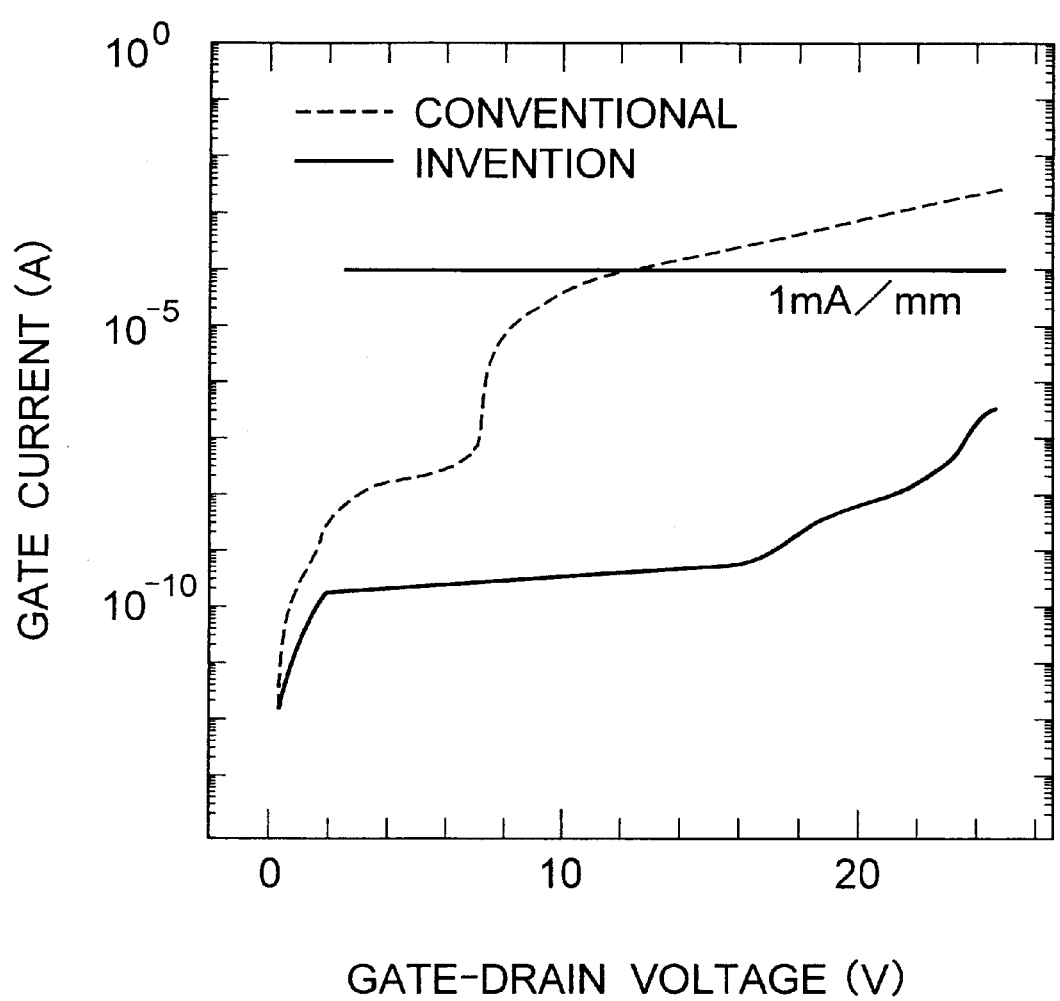
FIG. 16 is a graph illustrating the effect of an FET of the present invention with respect to the on-state breakdown voltage.

FIG. 16 shows the effect of the present invention with respect to the on-state breakdown voltage in the field-effect transistor. The graph of FIG. 16 shows the gate current of a GaAs MESFET having a gate width of 100 μm as measured when a voltage is applied between the gate and the source of the MESFET such that the gate potential is negative with respect to the source potential. Usually, a voltage at which a current of 1 mA/mm flows is defined as an on-state breakdown voltage. As seen from FIG. 16, the conventional FET exhibits a breakdown voltage of about 12 V, whereas, in the FET of the invention, the current does not reach 1 mA/mm even when the applied voltage is increased to 25 V, indicating a significant improvement in the breakdown voltage.

Since the above embodiments are described only for examples, the present invention is not limited to the above embodiments and various modifications or alterations can be easily made therefrom by those skilled in the art without departing from the scope of the present invention.

What is claimed is:

1. A field effect transistor (FET) comprising a substrate, a first epitaxial layer overlaying said substrate and having a first conductivity, a second epitaxial layer formed on said first epitaxial layer and having a second conductivity, and a gate metal formed on said second epitaxial layer in Schottky contact therewith, said second epitaxial layer having an impurity concentration and a thickness such that an electrically neutral region is formed in at least a portion of said second epitaxial layer disposed between said gate and a drain region in ohmic contact with said second epitaxial layer when said gate metal has a potential substantially equal to a potential of said drain region, forming a cascode FET connected between said gate and said drain.

2. The FET as defined in claim 1, wherein said gate metal penetrates said second epitaxial layer to electrically contact both said second epitaxial layer and said first epitaxial layer.

* * * * *